United States Patent
Luo et al.

(10) Patent No.: US 11,888,096 B2
(45) Date of Patent: Jan. 30, 2024

(54) QUANTUM DOT FORMULATIONS WITH THIOL-BASED CROSSLINKERS FOR UV-LED CURING

(71) Applicant: Applied Materials, Inc., Santa Clara, CA (US)

(72) Inventors: Yingdong Luo, Newark, CA (US); Sivapackia Ganapathiappan, Los Altos, CA (US); Daihua Zhang, Los Altos, CA (US); Hou T. Ng, Campbell, CA (US); Nag B. Patibandla, Pleasanton, CA (US)

(73) Assignee: Applied Materials, Inc., Santa Clara, CA (US)

( * ) Notice: Subject to any disclaimer, the term of this patent is extended or adjusted under 35 U.S.C. 154(b) by 151 days.

(21) Appl. No.: 17/380,998

(22) Filed: Jul. 20, 2021

(65) Prior Publication Data

US 2022/0029068 A1 Jan. 27, 2022

Related U.S. Application Data

(60) Provisional application No. 63/056,529, filed on Jul. 24, 2020.

(51) Int. Cl.
*H01L 33/50* (2010.01)
*H01L 27/15* (2006.01)
(Continued)

(52) U.S. Cl.
CPC ............ *H01L 33/502* (2013.01); *C08F 22/14* (2013.01); *C08G 75/045* (2013.01); *C09D 4/00* (2013.01);
(Continued)

(58) Field of Classification Search
CPC ..... H01L 33/502; H01L 33/56; H01L 27/156; C09K 11/025; C09D 4/06; C08G 75/045; C08F 22/14
See application file for complete search history.

(56) References Cited

U.S. PATENT DOCUMENTS 6,565,770 B1 5/2003 Mayer et al.
6,635,363 B1 10/2003 Duclos et al.
(Continued)

FOREIGN PATENT DOCUMENTS

CN 101336132 12/2008
CN 103597622 2/2014
(Continued)

OTHER PUBLICATIONS

Cheng-Chun et al., "Quantum dot-acrylic acrylate oligomer hybrid films emitting diodes," ACS Omega, Feb. 14, 2019, 4(2):3234-3243.
(Continued)

*Primary Examiner* — C Melissa Koslow
(74) *Attorney, Agent, or Firm* — Fish & Richardson P.C.

(57) ABSTRACT

A photocurable composition includes a nanomaterial selected to emit radiation in a first wavelength band in the visible light range in response to absorption of radiation in a second wavelength band in the UV or visible light range. The second wavelength band is different than the first wavelength band. The photocurable composition further includes one or more (meth)acrylate monomers, a thiol crosslinker, and a photoinitiator that initiates polymerization of the one or more (meth)acrylate monomers in response to absorption of radiation in the second wavelength band. A light-emitting device includes a plurality of light-emitting diodes and the cured photocurable composition in contact with a surface through which radiation in a first wavelength (Continued)

band in the UV or visible light range is emitted from each of the light-emitting diodes.

19 Claims, 8 Drawing Sheets

(51) Int. Cl.
| | |
|---|---|
| H01L 33/56 | (2010.01) |
| C09K 11/02 | (2006.01) |
| C08F 22/14 | (2006.01) |
| C09D 4/06 | (2006.01) |
| C09D 4/00 | (2006.01) |
| C08G 75/045 | (2016.01) |
| B82Y 20/00 | (2011.01) |
| B82Y 40/00 | (2011.01) |

(52) U.S. Cl.
CPC .............. *C09D 4/06* (2013.01); *C09K 11/025* (2013.01); *H01L 27/156* (2013.01); *H01L 33/56* (2013.01); *B82Y 20/00* (2013.01); *B82Y 40/00* (2013.01); *C08F 2800/20* (2013.01); *C08F 2810/20* (2013.01)

(56) References Cited

U.S. PATENT DOCUMENTS

| | | | |
|---|---|---|---|
| 7,915,319 | B2 | 3/2011 | Konarski et al. |
| 8,227,269 | B2 | 7/2012 | Chen et al. |
| 8,323,748 | B2 | 12/2012 | Ling |
| 8,425,065 | B2 | 4/2013 | Ravillisetty et al. |
| 9,111,464 | B2 | 8/2015 | Bibl et al. |
| 9,263,700 | B2 | 2/2016 | van Mol et al. |
| 9,541,256 | B2 | 1/2017 | Sung et al. |
| 10,048,530 | B1 | 8/2018 | Kim et al. |
| 10,759,993 | B2 | 9/2020 | Yang et al. |
| 11,094,530 | B2 | 8/2021 | Zhang |
| 11,646,397 | B2 | 5/2023 | Luo et al. |
| 2005/0040562 | A1 | 2/2005 | Steinmann et al. |
| 2005/0101684 | A1 | 5/2005 | You et al. |
| 2006/0105483 | A1 | 5/2006 | Leatherdale et al. |
| 2007/0015847 | A1 | 1/2007 | Sun et al. |
| 2008/0278068 | A1 | 11/2008 | Huang et al. |
| 2010/0117106 | A1 | 5/2010 | Trottier |
| 2010/0295077 | A1 | 11/2010 | Melman |
| 2012/0168671 | A1 | 7/2012 | Wang et al. |
| 2012/0195340 | A1 | 8/2012 | Cheon et al. |
| 2012/0267997 | A1 | 10/2012 | Kijima et al. |
| 2012/0285379 | A1 | 11/2012 | Hirakata et al. |
| 2013/0137027 | A1 | 5/2013 | Zhou et al. |
| 2013/0148057 | A1 | 6/2013 | Kang et al. |
| 2014/0049825 | A1 | 2/2014 | van Mol et al. |
| 2015/0083991 | A1 | 3/2015 | Tang et al. |
| 2015/0125702 | A1 | 5/2015 | He et al. |
| 2015/0179973 | A1 | 6/2015 | Willem et al. |
| 2015/0255505 | A1 | 9/2015 | Jeoung et al. |
| 2015/0270455 | A1 | 9/2015 | Naasani et al. |
| 2016/0005932 | A1* | 1/2016 | Lee ..................... C09K 11/703 252/301.36 |
| 2016/0075162 | A1 | 3/2016 | Lefebvre et al. |
| 2016/0107295 | A1 | 4/2016 | Bajaj et al. |
| 2016/0161088 | A1 | 6/2016 | Sung et al. |
| 2017/0100817 | A1 | 4/2017 | Ganapathiappan et al. |
| 2017/0183565 | A1 | 6/2017 | Jun et al. |
| 2017/0244010 | A1 | 8/2017 | Kim et al. |
| 2018/0044583 | A1* | 2/2018 | Kwon ..................... C08K 9/04 |
| 2018/0074240 | A1 | 3/2018 | Bonar et al. |
| 2018/0079953 | A1 | 3/2018 | Shin et al. |
| 2018/0102449 | A1 | 4/2018 | Pschenitzka et al. |
| 2018/0154024 | A1 | 6/2018 | Zhu et al. |
| 2018/0156951 | A1 | 6/2018 | Baek et al. |
| 2018/0267365 | A1 | 9/2018 | Eckert et al. |
| 2018/0277525 | A1 | 9/2018 | Cok et al. |
| 2018/0299755 | A1 | 10/2018 | Chou et al. |
| 2018/0308420 | A1 | 10/2018 | Shin et al. |
| 2018/0366622 | A1 | 12/2018 | Ulmer |
| 2019/0002719 | A1 | 1/2019 | Pousthomis et al. |
| 2019/0004369 | A1 | 1/2019 | Pousthomis et al. |
| 2019/0011819 | A1 | 1/2019 | Chou et al. |
| 2019/0088830 | A1 | 3/2019 | Hartlove et al. |
| 2019/0107755 | A1 | 4/2019 | Chen |
| 2019/0136126 | A1 | 5/2019 | Yang et al. |
| 2019/0194531 | A1 | 6/2019 | Oba et al. |
| 2019/0315623 | A1 | 10/2019 | Moriyama et al. |
| 2019/0345351 | A1 | 11/2019 | Hoggett et al. |
| 2020/0088920 | A1 | 3/2020 | Sakaino et al. |
| 2020/0102472 | A1 | 4/2020 | Spagnola et al. |
| 2020/0152841 | A1 | 5/2020 | Han et al. |
| 2020/0239765 | A1 | 7/2020 | Lee et al. |
| 2020/0365566 | A1 | 11/2020 | Zhang et al. |
| 2020/0365774 | A1 | 11/2020 | Zhang et al. |
| 2020/0373279 | A1 | 11/2020 | Ganapathiappan et al. |
| 2021/0139730 | A1 | 5/2021 | Isonaka et al. |
| 2021/0269710 | A1 | 9/2021 | Kang et al. |
| 2021/0358742 | A1 | 11/2021 | Zhang et al. |
| 2022/0069173 | A1 | 3/2022 | Luo et al. |
| 2023/0006110 | A1 | 1/2023 | Luo et al. |

FOREIGN PATENT DOCUMENTS

| | | |
|---|---|---|
| CN | 106195923 | 12/2016 |
| CN | 107636025 | 1/2018 |
| CN | 108136726 | 6/2018 |
| CN | 109638138 | 4/2019 |
| CN | 108257949 | 2/2020 |
| EP | 3032294 | 6/2016 |
| EP | 3147708 | 3/2017 |
| JP | 2008-159756 | 7/2008 |
| JP | 2010-267900 | 11/2010 |
| JP | 2017-062458 | 3/2017 |
| JP | 2019-085568 | 6/2019 |
| KR | 101906279 | * 10/2018 |
| KR | 2018-0138023 | 12/2018 |
| KR | 10-1969561 | 4/2019 |
| KR | 10-2019-0108366 | 9/2019 |
| TW | 201904105 | 1/2019 |
| TW | 201911565 | 3/2019 |
| WO | WO 2016/014299 | 1/2016 |
| WO | WO 2016/199424 | 12/2016 |
| WO | WO 2016/200972 | 12/2016 |
| WO | WO 2018/043616 | 3/2018 |
| WO | WO 2018/123821 | 7/2018 |
| WO | WO 2018/220168 | 12/2018 |

OTHER PUBLICATIONS

International Search Report and Written Opinion in International Appln. No. PCT/US2021/042367, dated Nov. 23, 2021, 10 pages.
Chen et al., "The hybridization of CdSe/ZnS quantum dot on InGaN light-emitting diodes for color conversion," IEEE transactions on nanotechnology, May 30, 2008, 7(4): 503-7.
Li, "Principles and Applications of Polymer Photochemistry", Fudan University Press, Jan. 1993, pp. 164-168 (with English translation).
Office action in Chinese Appln. No. 202180054839.1, dated Jul. 1, 2023, 17 pages (with English translation).
Song, "General Higher Education "The Thirteenth Five-Year" Plan Textbook Cosmetic Raw Materials", China Light Industry Press, Jul. 2018, p. 100 (with English translation).

* cited by examiner

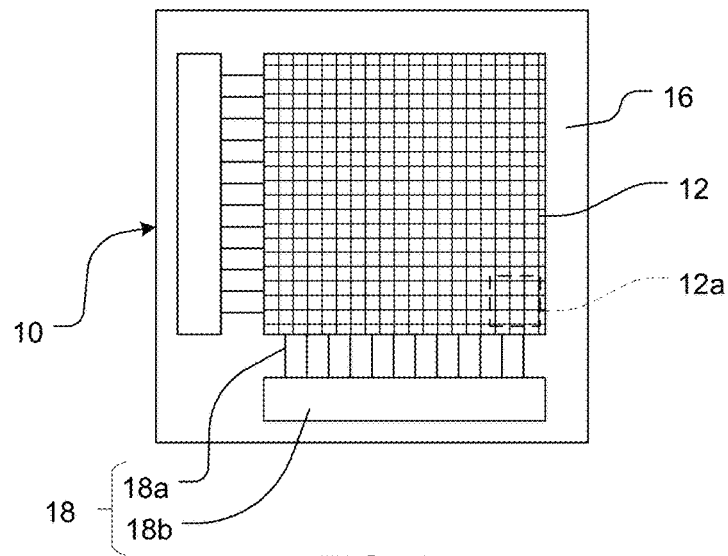
FIG. 2
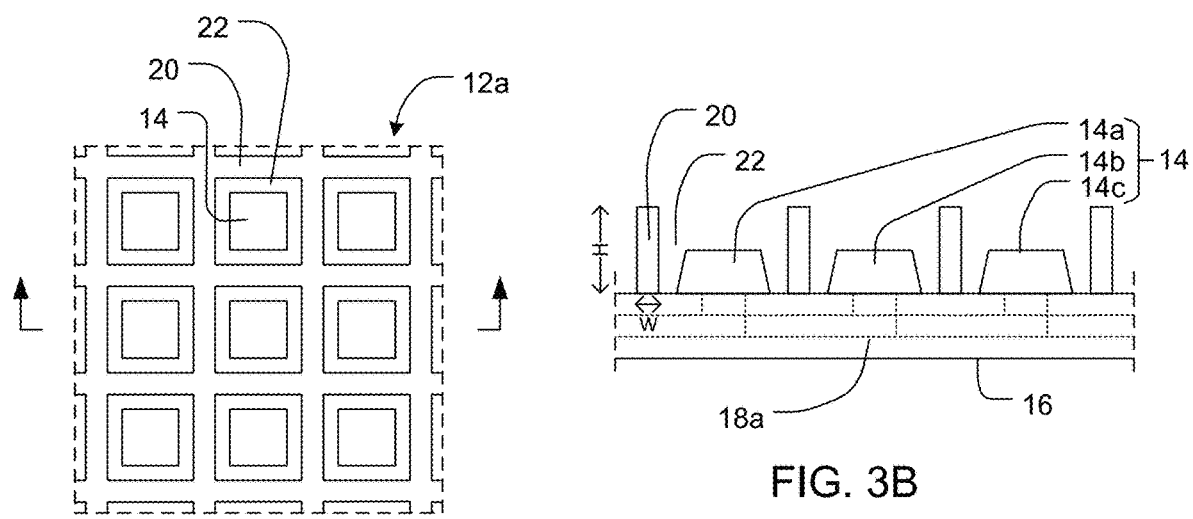
FIG. 3A
FIG. 3B

| Ex. | Quantum Dot (wt%) | Thiol (wt%) | Reactive Component | | | | | Photoinitiator (wt%) | Dosage (J/cm²) 385 nm | Top Cure (%) | Bottom Cure (%) |
|---|---|---|---|---|---|---|---|---|---|---|---|
| | | | IBOA (wt%) | HDDA (wt%) | EB40 (wt%) | 1006 (wt%) | DEAA (wt%) | | | | |
| E1 | 0 | 40 | | 60 | | | 0 | 4 | 0.6 | 64.9 | 80.5 |
| | | | | | | | | | 2.8 | 71.7 | 94.8 |
| E2 | 0 | 30 | | 70 | | | 0 | 4 | 0.6 | 60.1 | 90.2 |
| | | | | | | | | | 2.8 | 69.1 | 92.2 |
| E3 | 0 | 38 | | 58 | | | 4 | 4 | 0.6 | 71.6 | 94.7 |
| | | | | | | | | | 2.8 | 78.2 | 96.9 |
| E4 | 15 (R) | 32.3 | | 49.3 | | | 3.4 | 4 | 0.6 | 76.7 | 93.3 |
| | | | | | | | | | 2.8 | 80.5 | 94.6 |
| E5 | 15 (G) | 32.3 | | 49.3 | | | 3.4 | 4 | 0.6 | 75.4 | 94.3 |
| | | | | | | | | | 2.8 | 95.1 | 97.6 |
| CE1 | 0 | 0 | 0 | 100 | 0 | 0 | 0 | 2 | 0.6 | 40 | 85 |
| CE2 | 0 | 0 | 0 | 100 | 0 | 0 | 0 | 2 | 0.6 | 47 | 90 |
| CE3 | 0 | 0 | 0 | 50 | 50 | 0 | 0 | 2 | 0.6 | 63 | 85 |
| CE4 | 0 | 25 | 50 | 0 | 0 | 25 | 0 | 2 | 0.6 | 53 | 89 |
| CE5 | 0 | 0 | 47.5 | 0 | 0 | 47.5 | 5 | 2 | 0.6 | 44 | 83 |
| CE6 | 0 | 0 | 50 | 0 | 50 | 0 | 0 | 2 | 0.6 | 49 | 84 |

FIG. 8

QUANTUM DOT FORMULATIONS WITH THIOL-BASED CROSSLINKERS FOR UV-LED CURING

CROSS-REFERENCE TO RELATED APPLICATIONS

This application claims priority to U.S. application Ser. No. 63/056,529, filed on Jul. 24, 2020, the disclosure of which is incorporated by reference.

TECHNICAL FIELD

This disclosure generally relates to color conversion layers for light-emitting devices including thiol-based crosslinkers for UV-LED curing.

BACKGROUND

A light emitting diode (LED) panel uses an array of LEDs, with individual LEDs providing the individually controllable pixel elements. Such an LED panel can be used for a computer, touch panel device, personal digital assistant (PDA), cell phone, television monitor, and the like.

An LED panel that uses micron-scale LEDs based on III-V semiconductor technology (also called micro-LEDs) would have a variety of advantages as compared to OLEDs, e.g., higher energy efficiency, brightness, and lifetime, as well as fewer material layers in the display stack which can simplify manufacturing. However, there are challenges to fabrication of micro-LED panels. Micro-LEDs having different color emission (e.g., red, green and blue pixels) need to be fabricated on different substrates through separate processes. Integration of the multiple colors of micro-LED devices onto a single panel typically requires a pick-and-place step to transfer the micro-LED devices from their original donor substrates to a destination substrate. This often involves modification of the LED structure or fabrication process, such as introducing sacrificial layers to ease die release. In addition, stringent requirements on placement accuracy can limit the throughput, the final yield, or both.

An alternative approach to bypass the pick-and-place step is to selectively deposit color conversion agents (e.g., quantum dots, nanostructures, photoluminescent materials, or organic substances) at specific pixel locations on a substrate fabricated with monochrome LEDs. The monochrome LEDs can generate relatively short wavelength light, e.g., purple or blue light, and the color conversion agents can convert this short wavelength light into longer wavelength light, e.g., red or green light for red or green pixels. The selective deposition of the color conversion agents can be performed using high-resolution shadow masks or controllable inkjet or aerosol jet printing.

However, shadow masks are prone to problems with alignment accuracy and scalability, whereas inkjet and aerosol jet techniques suffer from resolution (inkjet), accuracy (inkjet) and throughput (aerosol jet) problems. In order to manufacture micro-LED displays, new techniques are needed to precisely and cost-effectively provide color conversion agents for different colors onto different pixels on a substrate, such as a large area substrate or flexible substrate.

SUMMARY

In one aspect, a photocurable composition includes a nanomaterial selected to emit radiation in a first wavelength band in the visible light range in response to absorption of radiation in a second wavelength band in the UV or visible light range, wherein the second wavelength band is different than the first wavelength band, one or more (meth)acrylate monomers, a thiol crosslinker, and a photoinitiator that initiates polymerization of the one or more (meth)acrylate monomers in response to absorption of radiation in the second wavelength band.

In another aspect, a light-emitting device has a plurality of light-emitting diodes and a cured composition in contact with a surface through which radiation in a first wavelength band in the UV or visible light range is emitted from each of the light-emitting diodes. The cured composition includes a nanomaterial selected to emit radiation in a second wavelength band in the visible light range in response to absorption of the radiation in the first wavelength band from each of the light-emitting diodes, and a photopolymer comprising a thiol crosslinker, wherein the nanomaterial is embedded in the photopolymer.

BRIEF DESCRIPTION OF THE DRAWINGS

FIG. 2 is a schematic top view of a micro-LED array that has already been integrated with a backplane.

FIG. 3A is a schematic top view of a portion of a micro-LED array.

FIG. 3B is a schematic cross-sectional view of the portion of the micro-LED array from FIG. 3A.

FIG. 8 is a table listing top and bottom cure percentages for photocurable compositions described in the Examples.

Like reference symbols in the various drawings indicate like elements.

DETAILED DESCRIPTION

Figure 1:
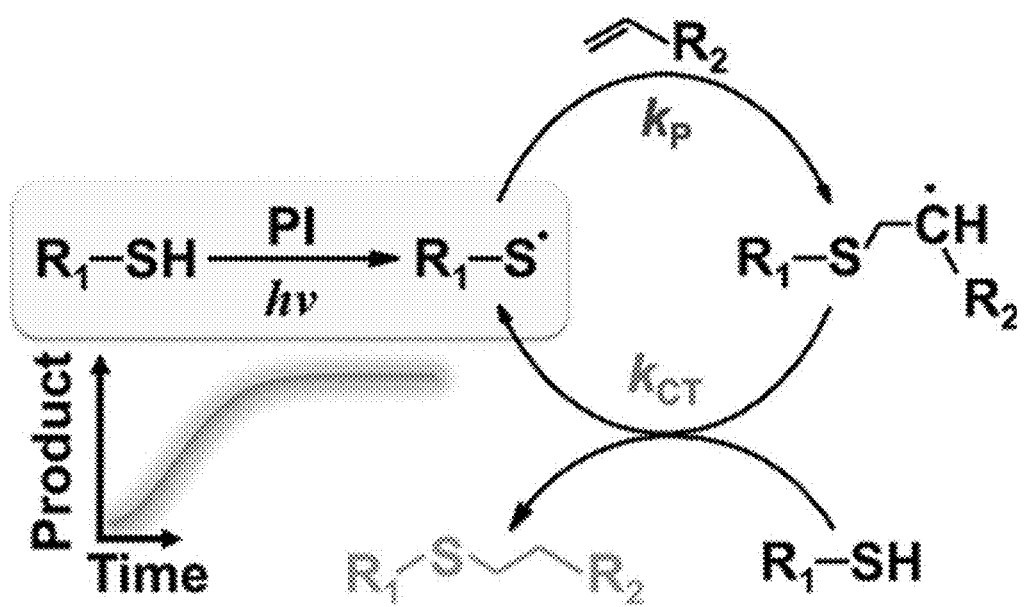
FIG. 1 depicts reactions in thiol-ene polymerization.

Quantum dots can be dispersed in acrylate formulations for inkjet printing.

Followed by UV curing, the quantum dots locked in a polyacrylate matrix can be used as a color conversion layer for advanced displays. However, acrylate polymerization can be inhibited by oxygen, which generates peroxyl radicals that inhibit further polymerization. Additionally, although UV LED has the advantages of longer life time, stable output, and narrow bandwidth (i.e., minimal infrared light and therefore cool curing), surface curing of the polyacrylate matrix can be inefficient and incomplete.

A technique that may address problems associated with inefficient and incomplete curing of color conversion layers in UV-LEDs includes using a photocurable composition including an anti-oxygen inhibition additive, a reactive component, a photoinitiator, a color conversion agent, an optional solvent, and optional additives. The anti-oxygen inhibition additive inhibits the formation of peroxyl radicals by oxygen. The reactive components include one or more monomers, crosslinkers, and other reactive compounds, exclusive of the anti-oxygen inhibition additive. The anti-oxygen inhibition additive improves the efficiency and extent of polymerization of the photocurable composition to yield a color conversion layer with improved surface curing.

As described in this disclosure, thiol compounds, including mono-thiols, di-thiols, tri-thiols, and multi-thiols, can be used as anti-oxygen inhibition crosslinking additives. Each mono-, di-, tri-, or multi-thiol functionality can be represented as RSH, where R is an aliphatic group or an aromatic group. One commercially available example is LED 02 from Allnex (Anderlecht, BE).

Examples of suitable mono-thiols include ethanethiol, propanethiols, butanethiols, pentanethiols, 1-hexadecanethiol, 2-ethylhexanethiol, 8-mercapto-1-octanol, 2-(2-methoxyethoxy)ethanethiol, 2-(trimethylsilyl)ethanethiol, 2-propene-1-thiol, thiophenols, thioglycolic acid, thioacetic acid, glutathione, cysteine, mercaptoethanols, 2-mercaptoethanol, 2-mercaptoindole, furan-2-ylmethanethiol, 3-mercaptopropane-1,2-diol, 3-mercapto-1-propanesulfonic acid, 1-hexadecanethiol, and pentachlorobenzenethiol.

Examples of suitable di-thiols include 1,1-dithiols (e.g., methanedithiol, 1,1-ethanedithiol, 1,1-cyclohexanedithiol), 1,2-dithiols (e.g., 1,3-propanedithiol, 1,2-ethanedithiol), and 1,3-dithiols (e.g., dihydrolipoic acid). 1,2-benzene-dimethanethiol, 1,3-benzenedimethanethiol, 1,4-benzenedimethanethiol, 2,2'-(ethylenedioxy)diethanethiol, ethylene glycol bis-mercaptoacetate, tetra(ethylene glycol) dithiol, hexa(ethylene glycol) dithiol, 2,2'-thiodiethanethiol, dimercaptosuccinic acid, dithiothreitol/dithioerythritol, and 1,16-hexadecanedithiol.

Examples of suitable tri-thiols include trithiocyanuric acid, trimethylolpropane tris(3-mercaptopropionate), and tris[2-(3-mercapto-propionyloxy)ethyl] isocyanurate.

Examples of suitable multi-thiols include pentaerythritol tetrakis(2-mercaptoacetate) and pentaerythritol tetrakis(3-mercaptopropionate).

In radical polymerizations, thiols (RSH) donate hydrogen to peroxyl radicals (ROO•) and generate thiyl radicals (RS•), which propagate (or crosslink) with alkenes. In addition, when thiols are present in a sufficient amount, polymerization of an acrylate-thiol formulation can occur through thiol-ene polymerization rather than or in addition to acrylate polymerization. Thiol-ene polymerization is less susceptible to oxygen inhibition than acrylate polymerization.

FIG. 1 depicts chemical reactions that occur during thiol-ene polymerization. When the propagation reaction rate ($k_P$) exceeds the chain transfer reaction rate ($k_{CT}$), chain transfer is the rate determining step, and the reaction rate ($R_P$) is first order with concentration of thiol ([SH]) (i.e., $R_P \alpha [SH]^1$). When $k_P$ and $k_{CT}$ have similar values (i.e., $k_P/k_{CT} \sim 1$), the reaction rate is determined by the concentration of the thiol and the concentration of the alkene ([C=C]) (i.e., $R_P \alpha [SH]^{1/2}[C=C]^{1/2}$). When the chain transfer reaction rate ($k_{CT}$) exceeds the propagation reaction rate ($k_P$), propagation is the rate determining step, and the reaction rate ($R_P$) is first order with concentration of alkene ([C=C]) (i.e., $R_P \alpha [C=C]^1$).

The reactive component increases the viscosity of the photocurable composition when subjected to polymerization, e.g., the photocurable composition can be solidified or form gel-like network structures. The reactive components include monomers, such as (meth)acrylate monomers, and can include one or more mono(meth)acrylates, di(meth)acrylates, tri(meth)acrylates, tetra(meth)acrylates, or a combination thereof. The reactive components can be provided by a negative photoresist, e.g., SU-8 photoresist. Examples of suitable mono(meth)acrylate include isobornyl (meth) acrylates, cyclohexyl (meth)acrylates, trimethylcyclohexyl (meth)acrylates, diethyl (meth)acrylamides, dimethyl (meth)acrylamides, and tetrahydrofurfuryl (meth)acrylates. The reactive component may include cross-linkers or other reactive compounds. Examples of suitable cross-linkers include polyethylene glycol di(meth)acrylates (e.g., diethylene glycol di(meth)acrylate or tripropylene glycol di(meth)acrylates), N,N'-methylenebis-(meth)acrylamides, pentaerythritol tri(meth)acrylates, and pentaerythritol tetra (meth)acrylates. Examples of suitable reactive compounds include polyethylene glycol (meth)acrylates, vinylpyrrolidone, vinylimidazole, styrenesulfonate, (meth)acrylamides, alkyl(meth)acrylamides, dialkyl(meth)acrylamides), hydroxyethyl(meth)acrylates, morpholinoethyl acrylates, and vinylformamides.

In some implementations, to retard or prevent free radical quenching by diatomic oxygen, which slows or inhibits the free radical curing mechanism, a curing atmosphere or environment that is oxygen-limited or free of oxygen may be implemented. Environments that are oxygen limited (e.g., less than 0.01 atm partial pressure) or free of oxygen include an inert gas atmosphere, and chemical reagents that are dry, degassed and mostly free of oxygen.

The photoinitiator initiates polymerization in response to radiation such as UV radiation, UV-LED radiation, visible radiation, and electron beam radiation. In some cases, the photoinitiator is responsive to UV or visible radiation. Suitable photoinitiators include free radical photoinitiators, such as bulk cure photoinitiators and surface cure photoinitiators.

Bulk cure photoinitiators cleave upon exposure to UV radiation, yielding a free radical, which may initiate polymerization. Bulk cure photoinitiators can be useful for both surface and through or bulk cure of the dispensed droplets. Bulk cure photoinitiators include benzoin ethers, benzyl ketals, acetyl phenones, alkyl phenones, phosphine oxides, benzophenone compounds, and thioxane compounds.

Surface cure photoinitiators are activated by UV radiation and form free radicals by hydrogen abstraction from a second compound, which becomes the actual initiating free radical. This second compound is often called a co-initiator or polymerization synergist, and may be an amine synergist. Amine synergists are used to diminish oxygen inhibition, and therefore, surface cure photoinitiators can be useful for fast surface cures. Surface cure photoinitiators include benzophenone compounds and thioxanthone compounds. An amine synergist is an amine with an active hydrogen. Amine synergists, such as amine-containing acrylates, may be combined with a benzophenone photoinitiator in a resin precursor composition formulation to: a) limit oxygen inhibition, b) fast cure a droplet or layer surface so as to fix the dimensions of the droplet or layer surface, and c), increase layer stability through the curing process.

Examples of suitable photoinitiators include 1-hydroxycyclohexylphenyl ketone, 4-isopropylphenyl-2-hydroxy-2-methyl propan-1-one, 1-[4-(2-hydroxyethoxy)-phenyl]-2-hydroxy-2-methyl-1-propan-1-one, 2,2-dimethyl-2-hydroxy-acetophenone, 2,2-dimethoxy-2-phenylacetophenone, 2-hydroxy-2-methylpropionphenone, diphenyl (2,4,6-trimethylbenzoyl) phosphine oxide, bis(2,6-dimethoxy-benzoyl)-2,4,6 trimethyl phenyl phosphine oxide, 2-methyl-1-1[4-(methylthio)phenyl]-2-morpholinopropan-1-one, 3,6-bis(2-methyl-2-morpholino-propionyl)-9-n-octylcarbazole, 2-benzyl-2-(dimethylamino)-1-(4-morpholinyl)phenyl)-1-butanone, benzophenone, 2,4,6-trimethylbenzophenone, isopropyl thioxantone, phenylbis (2,4,6-trimethylbenzoyl)phosphine oxide, 2-hydroxy-2-methyl-1phenyl-1-propanone. Suitable blends of photoinitiators commercially available include Darocur 4265, Irgacure 184, Irgacure 250, Irgacure 270, Irgacure 295, Irgacure 369, Irgacure 379, Irgacure 500, Irgacure 651, Irgacure 754, Irgacure 784, Irgacure 819, Irgacure 907, Irgacure 1173, Irgacure 2100, Irgacure 2022, Irgacure 4265, Irgacure TPO, Irgacure TPO-L, Esacure KT37, Esacure KT55, Esacure KT0046, Omnicat 250, and Omnicat 550. Suitable amine synergists include secondary and tertiary amine compounds with or without acrylic groups, such as diethanolamine, triethanolamine, and Genomer 5142.

Color conversion agents are materials that emit visible radiation in a first visible wavelength band in response to absorption of UV radiation or visible radiation in a second visible wavelength band. The UV radiation typically has a wavelength in a range of 200 nm to 400 nm. The visible radiation typically has a wavelength or wavelength band in a range of 400 nm to 800 nm. The first visible wavelength band is different (e.g., more energetic) than the second visible wavelength band. That is, the color conversion agents are materials that can convert the shorter wavelength light from a micro-LED into longer wavelength light (e.g., red, green, or blue).

Color conversion agents can include photoluminescent materials, such as organic or inorganic molecules, nanomaterials (e.g., nanoparticles, nanostructures, quantum dots), or other appropriate materials. Suitable nanomaterials typically include one or more III-V compounds. Examples of suitable compounds include CdSe, CdS, InP, PbS, CuInP, ZnSeS, and GaAs. In some cases, the nanomaterials include one or more elements selected from the group consisting of cadmium, indium, copper, silver, gallium, germanium, arsenide, aluminum, boron, iodide, bromide, chloride, selenium, tellurium, and phosphorus. In certain cases, the nanomaterials include one or more perovskites.

The quantum dots can be homogeneous or can have a core-shell structure. The quantum dots can have an average diameter in a range of about 1 nm to about 10 nm. One or more organic ligands are typically coupled to an exterior surface of the quantum dots. The organic ligands promote dispersion of the quantum dots in solvents. Suitable organic ligands include aliphatic amine, thiol or acid compounds, in which the aliphatic part typically has 6 to 30 carbon atoms, or thioalkyl compounds and carboxyalkanes. Examples of suitable nanostructures include nanoplatelets, nanocrystals, nanorods, nanotubes, and nanowires.

Optionally, the photocurable composition can include a solvent. The solvent can be organic or inorganic. Examples of suitable solvents include water, ethanol, toluene, dimethylformamide, methylethylketone, or a combination thereof. The solvent can be selected to provide a desired surface tension or viscosity for the photocurable composition. The solvent can also improve chemical stability of the other components.

Optionally, the photocurable composition can include a straylight absorber or a UV blocker. Examples of suitable straylight absorbers include Disperse Yellow 3, Disperse Yellow 7, Disperse Orange 13, Disperse Orange 3, Disperse Orange 25, Disperse Black 9, Disperse Red 1 acrylate, Disperse Red 1 methacrylate, Disperse Red 19, Disperse Red 1, Disperse Red 13, and Disperse Blue 1. Examples of suitable UV blockers include benzotriazolyl hydroxyphenyl compounds.

Optionally, the first photocurable composition can include one or more other functional ingredients. As one example, the functional ingredients can affect the optical properties of the color conversion layer. For example, the functional ingredients can include nanoparticles with a sufficiently high index of refraction (e.g., at least about 1.7) that the color conversion layer functions as an optical layer that adjusts the optical path of the output light, e.g., provides a microlens. Examples of suitable nanoparticles include $TiO_2$, $ZnO_2$, $ZrO_2$, $CeO_2$, or a mixture of two or more of these oxides. Alternatively or in addition, the nanoparticles can have an index of refraction selected such that the color conversion layer functions as an optical layer that reduces total reflection loss, thereby improving light extraction. As another example, the functional ingredients can include a dispersant or surfactant to adjust the surface tension of the photocurable composition. Examples of suitable dispersants or surfactants include siloxane and polyethylene glycol. As yet another example, the functional ingredients can include a photoluminescent pigment that emits visible radiation. Examples of suitable photoluminescent pigments include zinc sulfide and strontium aluminate.

In some cases, the photocurable composition includes about 0.1 wt % to about 50 wt % anti-oxygen inhibition additive (e.g., 0.1 wt % to 1 wt %, 1 wt % to 5 wt %, 5 wt % to 10 wt %, 20 wt % to 30 wt %, 30 wt % to 40 wt %, 40 wt % to 50 wt %, 5 wt % to 45 wt %, 10 wt % to 40 wt %, 15 wt % to 35 wt %, or 20 wt % to 30 wt %), up to about 90 wt % of the reactive component, about 0.5 wt % to about 5 wt % of a photoinitiator, and about 0.1 wt % to about 10 wt % (e.g., about 1 wt % to about 2 wt %) of a color conversion agent (e.g., a nanomaterial). The photocurable composition may also include a solvent (e.g., up to about 10 wt % of a solvent).

In some cases, the photocurable composition includes about 0.1 wt % to about 50 wt % anti-oxygen inhibition additive, about 1 wt % to about 10 wt % of the reactive component, about 0.5 wt % to about 5 wt % of a photoinitiator, and about 0.1 wt % to about 10 wt % (e.g., about 1 wt % to about 2 wt %) of a color conversion agent (e.g., a nanomaterial), and about 10 wt % to about 90 wt % of a solvent.

The photocurable composition can optionally include up to about 5 wt % of a surfactant or dispersant, about 0.01 wt % to about 5 wt % (e.g., about 0.1 wt % to about 1 wt %) of a straylight absorber, or any combination thereof.

A viscosity of the photocurable composition is typically in a range of about 10 cP (centiPoise) to about 2000 cP at room temperature (e.g., about 10 cP to about 150 cP). A surface tension of the photocurable composition is typically in a range of about 20 milliNewtons per meter (mN/m) to about 60 mN/m (e.g., about 40 mN/m to about 60 mN/m). After curing, an elongation at break of the cured photocurable composition is typically in a range of about 1% to about 200%. A tensile strength of the cured photocurable composition is typically in a range of about 1 megaPascal (MPa) to about 1 gigaPascal (GPa). The photocurable composition can be applied in one or more layers, and a thickness of the cured photocurable composition is typically in a range of about 10 nm to about 100 microns (e.g., about 10 nm to about 20 microns, about 10 nm to about 1000 nm, or about 10 nm to about 100 nm).

The photocurable compositions described in this disclosure are implemented as color conversion layers in displays, such as micro-LED displays described with respect to FIGS. 2-7.

FIG. 2 illustrates a micro-LED display 10 that includes an array 12 of individual micro-LEDs 14 (see FIGS. 3A and 3B) disposed on a backplane 16. The micro-LEDs 14 are already integrated with backplane circuitry 18 so that each micro-LED 14 can be individually addressed. For example, the backplane circuitry 18 can include a TFT active matrix array with a thin-film transistor and a storage capacitor (not illustrated) for each micro-LED, column address and row address lines 18a, column and row drivers 18b, etc., to drive the micro-LEDs 14. Alternatively, the micro-LEDs 14 can be driven by a passive matrix in the backplane circuitry 18. The backplane 16 can be fabricated using conventional CMOS processes.

FIGS. 3A and 3B illustrate a portion 12a of the micro-LED array 12 with the individual micro-LEDs 14. All of the micro-LEDs 14 are fabricated with the same structure so as to generate the same wavelength range (this can be termed "monochrome" micro-LEDs). For example, the micro-LEDs 14 can generate light in the ultraviolet (UV), e.g., the near ultraviolet, range. For example, the micro-LEDs 14 can generate light in a range of 365 to 405 nm. As another example, the micro-LEDs 14 can generate light in the violet or blue range. The micro-LEDs can generate light having a spectral bandwidth of 20 to 60 nm.

FIG. 3B illustrates a portion of the micro-LED array that can provide a single pixel. Assuming the micro-LED display is a three-color display, each pixel includes three sub-pixels, one for each color, e.g., one each for the blue, green and red color channels. As such, the pixel can include three micro-LEDs 14a, 14b, 14c. For example, the first micro-LED 14a can correspond to a blue subpixel, the second micro-LED 14b can correspond to a green subpixel, and the third micro-LED 14c can correspond to a red subpixel. However, the techniques discussed below are applicable to micro-LED displays that use a larger number of colors, e.g., four or more colors. In this case, each pixel can include four or more micro-LEDs, with each micro-LED corresponding to a respective color. In addition, the techniques discussed below are applicable to micro-LED displays that use just two colors.

In general, the monochrome micro-LEDs 14 can generate light in a wavelength range having a peak with a wavelength no greater than the wavelength of the highest-frequency color intended for the display, e.g., purple or blue light. The color conversion agents can convert this short wavelength light into longer wavelength light, e.g., red or green light for red or green subpixels. If the micro-LEDs generate UV light, then color conversion agents can be used to convert the UV light into blue light for the blue subpixels.

Vertical isolation walls 20 are formed between neighboring micro-LEDs. The isolation walls provide for optical isolation to help localize polymerization and reduce optical crosstalk during the in-situ polymerization discussed below. The isolation walls 20 can be a photoresist or metal, and can be deposited by conventional lithography processes. As shown in FIG. 3A, the walls 20 can form a rectangular array, with each micro-LED 14 in an individual recess 22 defined by the walls 20. Other array geometries, e.g., hexagonal or offset rectangular arrays, are also possible. Possible processes for back-plane integration and isolation wall formation are discussed in more detail below.

The walls can have a height H of about 3 to 20 μm. The walls can have a width W of about 2 to 10 μm. The height H can be greater than the width W, e.g., the walls can have an aspect ratio of 1.5:1 to 5:1. The height H of the wall is sufficient to block light from one micro-LED from reaching an adjacent micro-LED.

Figure 4A:
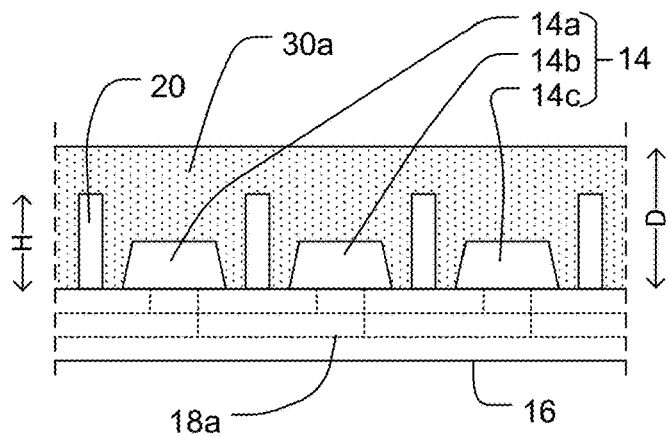
FIGS. 4A-4H illustrate a method of selectively forming color conversion agent (CCA) layers over a micro-LED array.

FIGS. 4A-4H illustrate a method of selectively forming color conversion agent (CCA) layers over a micro-LED array. Initially, as shown in FIG. 4A, a first photocurable composition 30a is deposited over the array of micro-LEDs 14 that are already integrated with the backplane circuitry.

The first photocurable composition 30a can have a depth D greater than a height H of the isolation walls 20.

Figure 5A:
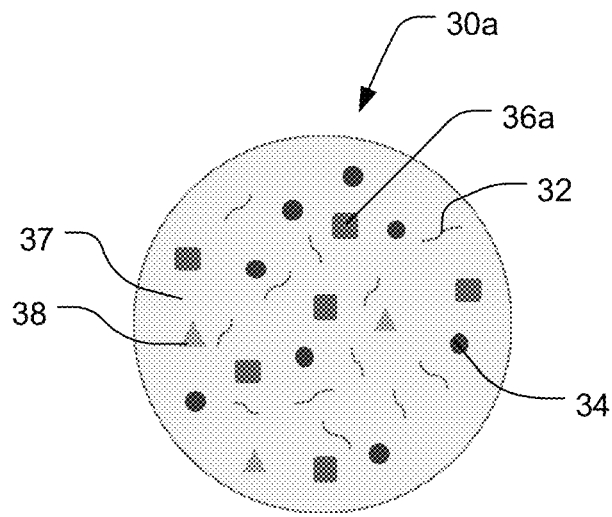
FIGS. 5A-5C illustrate formulations of photocurable composition.
Figure 5B:
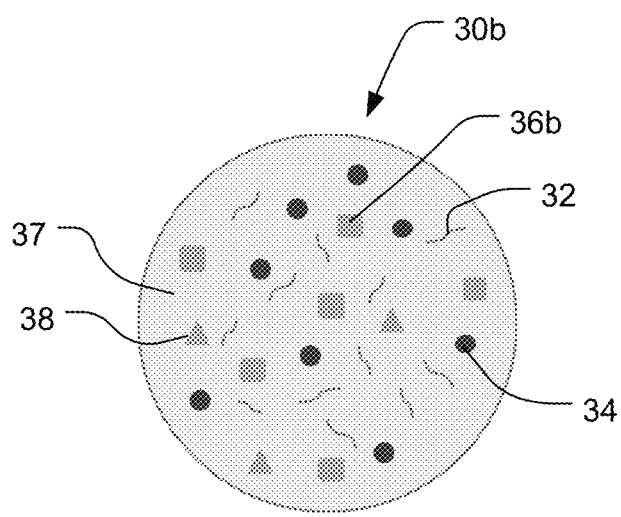
Figure 5C:
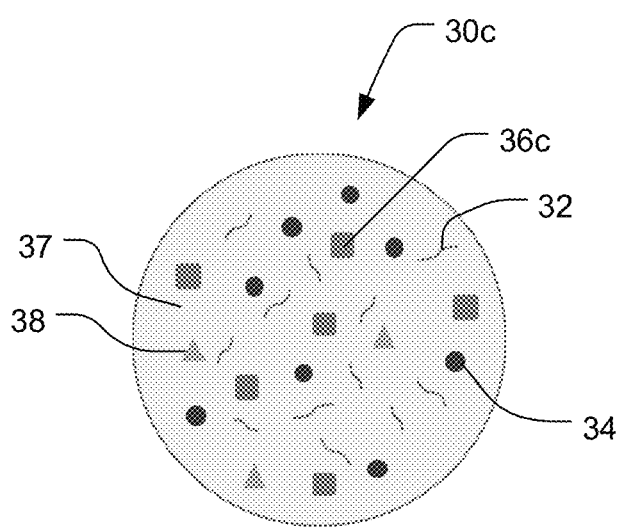

Referring to FIGS. 5A-5C, a photocurable composition (e.g., first photocurable composition 30a, second photocurable composition 30b, third photocurable composition 30c, etc.) includes a polymerizable components 32, a photoinitiator 34 to trigger polymerization under illumination of a wavelength corresponding to the emission of the micro-LEDs 14, and color conversion agents 36a. The polymerizable component 32 includes a reactive component and an anti-oxygen inhibition additive as described herein. As noted above, optionally the photocurable composition can include a solvent 37. In addition, optionally the first photocurable composition can include one or more other functional ingredients 38.

After curing of the photocurable composition, components of the photoinitiator 34 may be present in the cured photocurable composition (the photopolymer), where the components are fragments of the photoinitiator formed during breaking of bonds in the photoinitiator in the photo-initiation process.

Returning to FIG. 4A, the first photocurable composition 30a can be deposited on the display over the micro-LED array by a spin-on, dipping, spray-on, or inkjet process. An inkjet process can be more efficient in consumption of the first photocurable composition 30a.

Figure 4B:
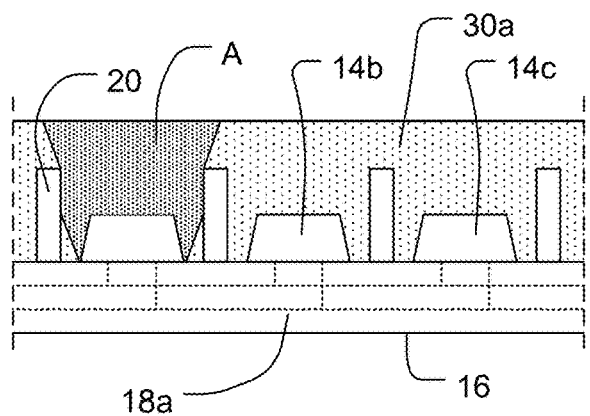

Next, as shown in FIG. 4B, the circuitry of the backplane 16 is used to selectively activate a first plurality of micro-LEDs 14a. This first plurality of micro-LEDs 14a correspond to the sub-pixels of a first color. In particular, the first plurality of micro-LEDs 14a correspond to the sub-pixels for the color of light to be generated by the color conversion components in the photocurable composition 30a. For example, assuming the color conversion component in the fluid 30a will convert light from the micro-LED 14 into blue light, then only those micro-LEDs 14a that correspond to blue sub-pixels are turned on. Because the micro-LED array is already integrated with the backplane circuitry 18, power can be supplied to the micro-LED display 10 and control signals can be applied by a microprocessor to selectively turn on the micro-LEDs 14a.

Figure 4C:
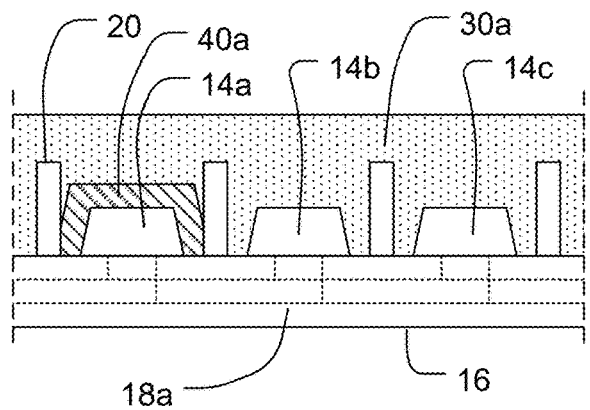

Referring to FIGS. 4B and 4C, activation of the first plurality of micro-LEDs 14a generates illumination A (see FIG. 4B) which causes in-situ curing of the first photocurable composition 30a to form a first solidified color conversion layer 40a (see FIG. 4C) over each activated micro-LED 14a. In short, the fluid 30a is cured to form color conversion layers 40a, but only on the selected micro-LEDs 14a. For example, a color conversion layer 40a for converting to blue light can be formed on each micro-LED 14a.

In some implementations, the curing is a self-limiting process. For example, illumination, e.g., UV illumination, from the micro-LEDs 14a can have a limited penetration depth into the photocurable composition 30a. FIG. 4B illustrates the illumination A reaching a top surface of the photocurable composition 30a. The cure percentage of the top surface is typically at least 70%, at least 80%, or at least 90%, as assessed by attenuated total reflect infrared (ATR-IR). The cure percentage can be assessed by calculating the area for a peak corresponding to unreacted double bonds in a photocurable composition, curing the photocurable composition, calculating the area for the peak corresponding to the unreacted double bonds in the cured color conversion layer, and then comparing the results to obtain the cure percentage. In some cases, the cure percentage of the top surface is at least 1.5 times the cure percentage of the top surface of a composition that differs only by the absence of a thiol crosslinker.

In some implementations, the illumination from the selected micro-LEDs 14a does not reach the other micro-LEDs 14b, 14c. In this circumstance, the isolation walls 20 may not be necessary. However, if the spacing between the micro-LEDs 14 is sufficiently small, isolation walls 20 can affirmatively block illumination A from the selected micro-LED 14a from reaching the area over the other micro-LEDs that would be within the penetration depth of the illumination from those other micro-LEDs. Isolation walls 20 can also be included, e.g., simply as insurance against illumination reaching the area over the other micro-LEDs.

The driving current and drive time for the first plurality of micro-LEDs 14a can be selected for appropriate photon dosage for the photocurable composition 30a. The power per subpixel for curing the fluid 30a is not necessarily the same as the power per subpixel in a display mode of the micro-LED display 10. For example, the power per subpixel for the curing mode can be higher than the power per subpixel for the display mode.

Figure 4D:
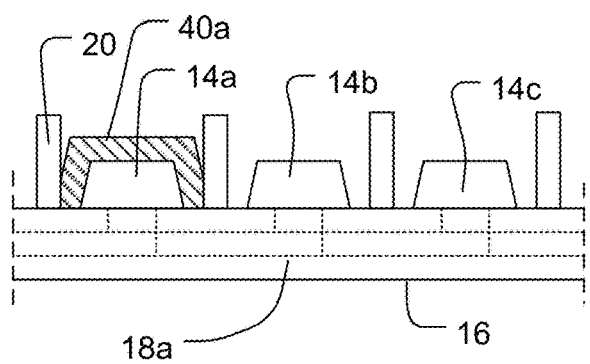

Referring to FIG. 4D, when curing is complete and the first solidified color conversion layer 40a is formed, the residual uncured first photocurable composition is removed from the display 10. This leaves the other micro-LEDs 14b, 14c, exposed for the next deposition steps. In some implementations, the uncured first photocurable composition 30a is simply rinsed from the display with a solvent, e.g., water, ethanol, toluene, dimethylformamide, or methylethylketone, or a combination thereof. If the photocurable composition 30a includes a negative photoresist, then the rinsing fluid can include a photoresist developer for the photoresist.

Figure 4E:
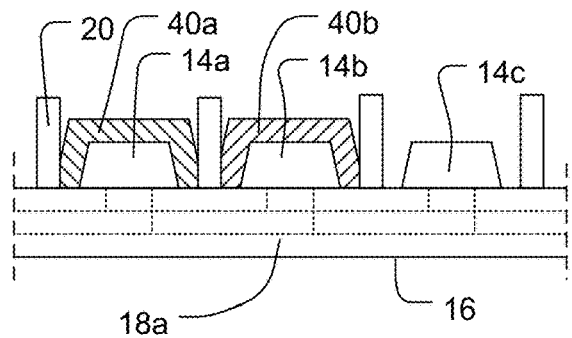

Referring to FIGS. 4E and 5B, the treatment described above with respect to FIGS. 4A-4D is repeated, but with a second photocurable composition 30b (see FIG. 5B) and activation of a second plurality of micro-LEDs 14b. After rinsing, a second color conversion layer 40b is formed over each of the second plurality of micro-LEDs 14b.

The second photocurable composition 30b is similar to the first photocurable composition 30a, but includes color conversion agents 36b to convert the shorter wavelength light from the micro-LEDs 14 into longer wavelength light of a different second color. The second color can be, for example, green.

The second plurality of micro-LEDs 14b correspond to the sub-pixels of a second color. In particular, the second plurality of micro-LEDs 14b correspond to the sub-pixels for the color of light to be generated by the color conversion components in the second photocurable composition 30b. For example, assuming the color conversion component in the fluid 30a will convert light from the micro-LED 14 into green light, then only those micro-LEDs 14b that correspond to green sub-pixels are turned on.

Figure 4F:
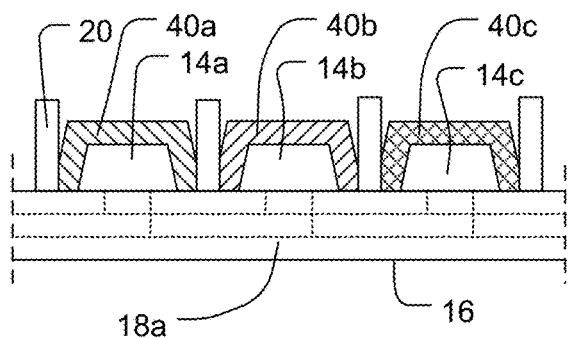

Referring to FIGS. 4F and 5C, optionally the treatment described above with respect to FIGS. 4A-4D is repeated yet again, but with a third photocurable composition 30c (see FIG. 5C) and activation of a third plurality of micro-LEDs 14c. After rinsing, a third color conversion layer 40c is formed over each of the third plurality of micro-LEDs 14c.

The third photocurable composition 30c is similar to the first photocurable composition 30a, but includes color conversion agents 36c to convert the shorter wavelength light from the micro-LEDs 14 into longer wavelength light of a different third color. The third color can be, for example, red.

The third plurality of micro-LEDs 14c correspond to the sub-pixels of a third color. In particular, the third plurality of micro-LEDs 14c correspond to the sub-pixels for the color of light to be generated by the color conversion components in the third photocurable composition 30c. For example, assuming the color conversion component in the fluid 30c will convert light from the micro-LED 14 into red light, then only those micro-LEDs 14c that correspond to red sub-pixels are turned on.

In this specific example illustrated in FIGS. 4A-4F, color conversion layers 40a, 40b, 40c are deposited for each color sub-pixel. This is needed, e.g., when the micro-LEDs generate ultraviolet light.

However, the micro-LEDs 14 could generate blue light instead of UV light. In this case, the coating of the display 10 by a photocurable composition containing blue color conversion agents can be skipped, and the process can be performed using the photocurable compositions for the green and red subpixels. One plurality of micro-LEDs is left without a color conversion layer, e.g., as shown in FIG. 4E. The process shown by FIG. 4F is not performed. For example, the first photocurable composition 30a could include green CCAs and the first plurality 14a of micro-LEDs could correspond to the green subpixels, and the second photocurable composition 30b could include red CCAs and the second plurality 14b of micro-LEDs could correspond to the red subpixels.

Figure 4G:
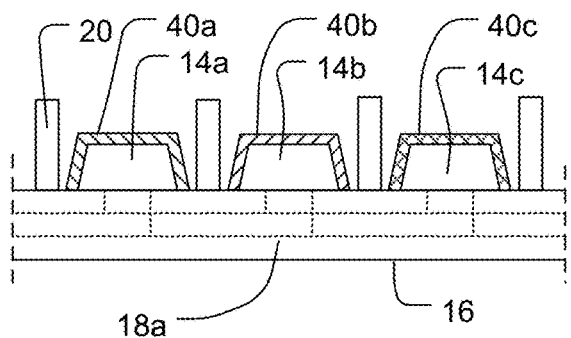

Assuming that the fluids 30a, 30b, 30c included a solvent, some solvent may be trapped in the color conversion layers 40a, 40b, 40c. Referring to FIG. 4G, this solvent can be evaporated, e.g., by exposing the micro-LED array to heat, such as by IR lamps. Evaporation of the solvent from the color conversion layers 40a, 40b, 40c can result in shrinking of the layers so that the final layers are thinner.

Removal of the solvent and shrinking of the color conversion layers 40a, 40b, 40c can increase concentration of color conversion agents, e.g., quantum dots, thus providing higher color conversion efficiency. On the other hand, including a solvent permits more flexibility in the chemical formulation of the other components of the photocurable compositions, e.g., in the color conversion agents or crosslinkable components.

Figure 4H:
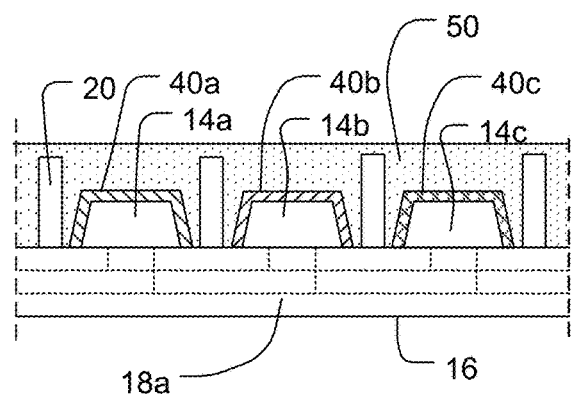

Optionally, as shown in FIG. 4H, a UV blocking layer 50 can be deposited on top of all of the micro-LEDs 14. The UV blocking layer 50 can block UV light that is not absorbed by the color conversion layers 40. The UV blocking layer 50 can be a Bragg reflector, or can simply be a material that is selectively absorptive to UV light (e.g., a benzotriazolyl hydroxyphenyl compound). A Bragg reflector can reflect UV light back toward the micro-LEDs 14, thus increasing energy efficiency. Other layers, such as straylight absorbing layers, photoluminescent layers, and high refractive index layers include materials may also be optionally deposited on micro-LEDs 14.

Thus, as described herein, a photocurable composition includes a nanomaterial selected to emit radiation in a first wavelength band in the visible light range in response to absorption of radiation in a second wavelength band in the UV or visible light range, an anti-oxygen inhibition additive (e.g., one or more thiols), a reactive component (e.g., one or more acrylate monomers), a color conversion additive (e.g., quantum dots), and a photoinitiator that initiates polymerization of the active component in response to absorption of radiation in the second wavelength band. The second wavelength band is different than the first wavelength band. The anti-oxygen inhibition additive increases the efficiency and extent of surface curing of the photocurable composition.

In some implementations, a light-emitting device includes a plurality of light-emitting diodes, and a cured composition in contact with a surface through which radiation in a first wavelength band in the UV or visible light range is emitted from each of the light-emitting diodes. The cured composition includes a nanomaterial selected to emit radiation in a second wavelength band in the visible light range in response to absorption of radiation in the first wavelength band from each of the light-emitting diodes, a photopolymer, and components (e.g., fragments) of a photoinitiator that initiates polymerization of the photopolymer in response to absorption of radiation in the first wavelength band. The second wavelength band is different than the first wavelength band.

In certain implementations, a light-emitting device includes an additional plurality of light-emitting diodes and an additional cured composition in contact with a surface through which radiation in the first wavelength band is emitted from each of the additional light-emitting diodes. The additional cured composition includes an additional nanomaterial selected to emit radiation in a third wavelength band in the visible light range in response to absorption of radiation in the first wavelength band from each of the light-emitting diodes, an additional photopolymer, an additional anti-oxygen inhibition additive, and components of an additional photoinitiator that initiates polymerization of the photopolymer in response to absorption of radiation in the first wavelength band. The third wavelength band can be different than the second wavelength band.

Figure 6A:
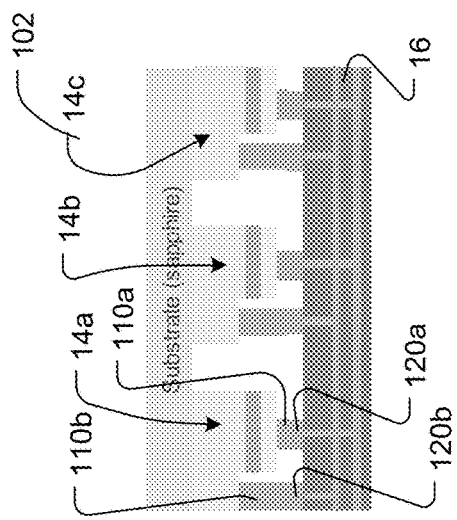
FIGS. 6A-6E illustrate a method of fabricating a micro-LED array and isolation walls on a backplane.

FIGS. 6A-6E illustrate a method of fabricating a micro-LED array and isolation walls on a backplane. Referring to FIG. 6A, the process starts with the wafer 100 that will provide the micro-LED array. The wafer 100 includes a substrate 102, e.g., a silicon or a sapphire wafer, on which are disposed a first semiconductor layer 104 having a first doping, an active layer 106, and a second semiconductor layer 108 having a second opposite doping. For example, the first semiconductor layer 104 can be an n-doped gallium nitride (n-GaN) layer, the active layer 106 can be a multiple quantum well (MQW) layer 106, and the second semiconductor layer 108 can be a p-doped gallium nitride (p-GaN) layer.

Figure 6B:
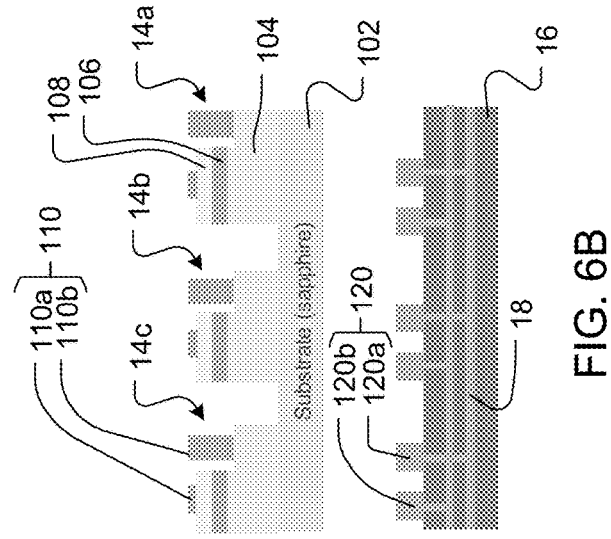

Referring to FIG. 6B, the wafer 100 is etched to divide the layers 104, 106, 108 into individual micro-LEDs 14, including the first, second and third plurality of micro-LEDs 14a, 14b, 14c that correspond to the first, second and third colors. In addition, conductive contacts 110 can be deposited. For example, a p-contact 110a and an n-contact 110b can be deposited onto the n-GaN layer 104 and p-GaN layer 108, respectively.

Similarly, the backplane 16 is fabricated to include the circuitry 18, as well as electrical contacts 120. The electrical contacts 120 can include first contacts 120a, e.g., drive contacts, and second contacts 120b, e.g., ground contacts.

Figure 6D:
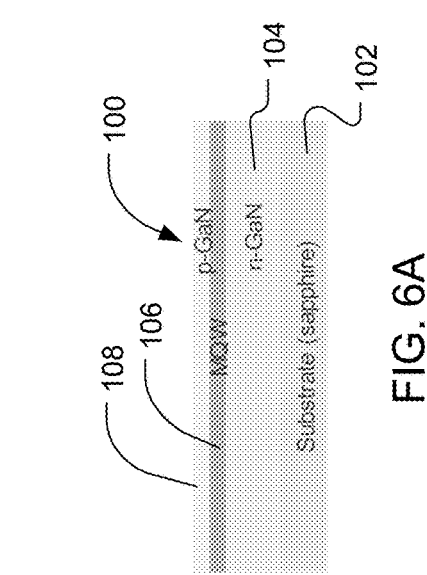
Figure 6C:
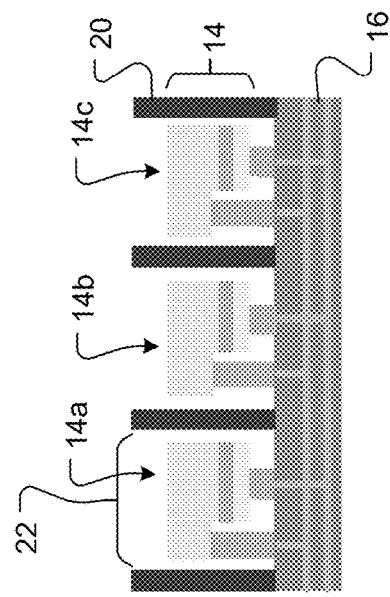

Referring to FIG. 6C, the micro-LED wafer 100 is aligned and placed in contact with the backplane 16. For example, the first contacts 110a can contact the first contacts 120a, and the second contacts 110b can contact the second contacts 120b. The micro-LED wafer 100 could be lowered into contact with the backplane, or vice-versa.

Next, referring to FIG. 6D, the substrate 102 is removed. For example, a silicon substrate can be removed by polishing away the substrate 102, e.g., by chemical mechanical polishing. As another example, a sapphire substrate can be removed by a laser liftoff process.

Figure 6E:
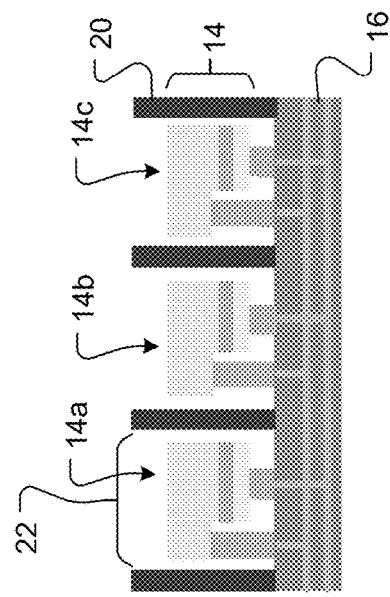

Finally, referring to FIG. 6E, the isolation walls 20 are formed on the backplane 16 (to which the micro-LEDs 14 are already attached). The isolation walls can be formed by a conventional process such as deposition of photoresist, patterning of the photoresist by photolithography, and development to remove the portions of the photoresist corresponding to the recesses 22. The resulting structure can then be used as the display 10 for the processed described for FIGS. 4A-4H.

FIGS. 7A-7D illustrate another method of fabricating a micro-LED array and isolation walls on a backplane. This process can be similar to the process discussed above for FIGS. 6A-6E, except as noted below.

Figure 7B:
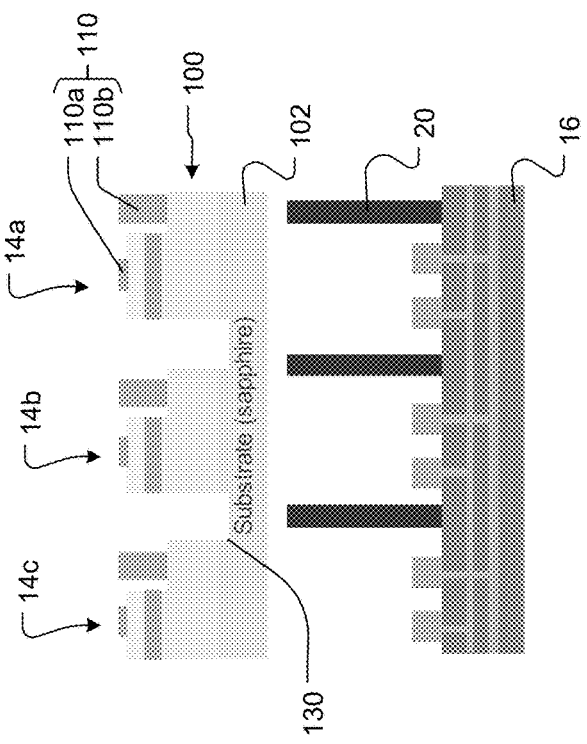
FIGS. 7A-7D illustrate another method of fabricating a micro-LED array and isolation walls on a backplane.
Figure 7D:
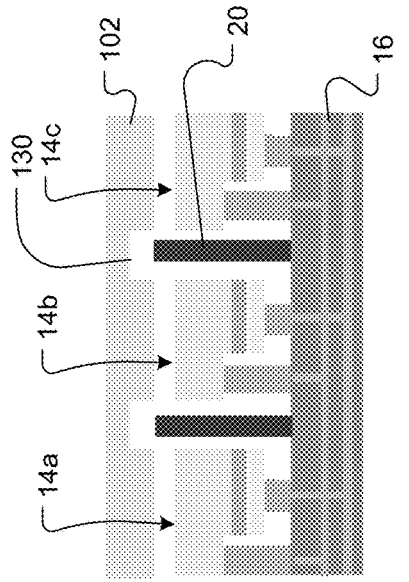
Figure 7A:
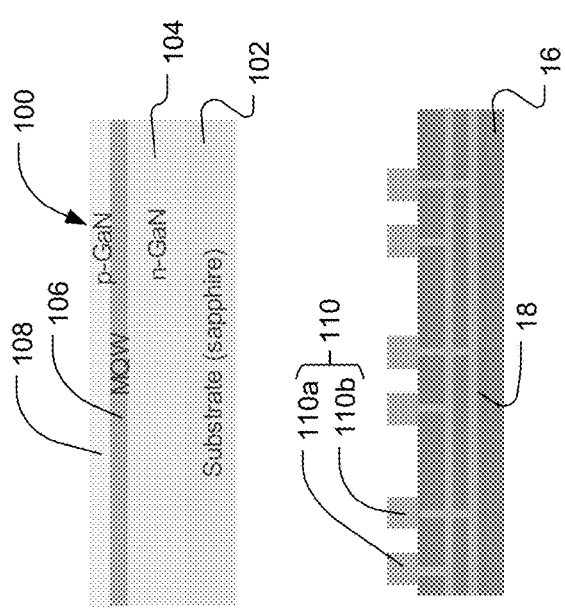

Referring to FIG. 7A, the process starts similarly to the process described above, with the wafer 100 that will provide the micro-LED array and the backplane 16.

Referring to FIG. 7B, the isolation walls 20 are formed on the backplane 16 (to which the micro-LEDs 14 are not yet attached).

In addition, the wafer 100 is etched to divide the layers 104, 106, 108 into individual micro-LEDs 14, including the first, second and third plurality of micro-LEDs 14a, 14b, 14c. However, the recesses 130 formed by this etching process are sufficiently deep to accommodate the isolation walls 20. For example, the etching can continue so that the recesses 130 extend into the substrate 102.

Figure 7C:
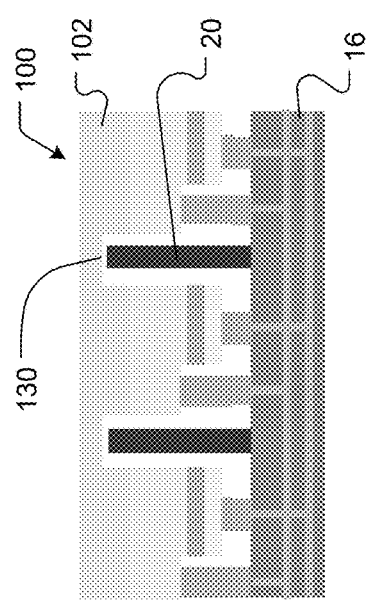

Next, as shown in FIG. 7C, the micro-LED wafer 100 is aligned and placed in contact with the backplane 16 (or vice-versa). The isolation walls 20 fit into the recesses 130. In addition, the contacts 110 of the micro-LEDs are electrically connected to the contacts 120 of the backplane 16.

Finally, referring to FIG. 7D, the substrate 102 is removed. This leaves the micro-LEDs 14 and isolation walls 20 on the backplane 16. The resulting structure can then be used as the display 10 for the processed described for FIGS. 4A-4H.

Terms of positioning, such as vertical and lateral, have been used. However, it should be understood that such terms refer to relative positioning, not absolute positioning with respect to gravity. For example, laterally is a direction parallel to a substrate surface, whereas vertically is a direction normal to the substrate surface.

Examples

Example photocurable compositions including a thiol compound were prepared. The top and bottom cure percentage of these example compositions were compared with top and bottom cure percentages obtained for comparative photocurable compositions with no added thiol compound. Table 1 shows top and bottom cure percentages for Examples 1-5 (E1-E5) and Comparative Examples 1-6 (CE1-CE6). In Table 1 (FIG. 8), the reactive component includes a mono-acrylate (isobornyl acrylate (IBOA), di(ethylene glycol) ethyl ether acrylate (DEAA)), a di-acrylate (6-hexanediol diacrylate (HDDA)), a non-thiol crosslinker (e.g., an acrylate crosslinker, such as multifunctional acrylates EB40 (available from Allnex) or 1006 (available from Dymax). The anti-oxygen inhibition agent is EBECRYL LED 02 (available from Allnex), a mercapto modified polyester acrylate resin. The photoinitiator is TPO (diphenyl(2,4,6-trimethylbenzoyl)phosphine oxide). The quantum dots are available from Nanosys.

Examples 1-5 and Comparative Examples 1-6 were prepared by combining the components listed in Table 1, with 100 wt % corresponding to the total amount of thiol component, reactive component, and color conversion component (quantum dots). The Examples and Comparative Examples were cured with the dosage indicated in Table 1 at 385 nm.

Top and bottom cure percentages were assessed by drawdown coating a 125 µm thick film of photocurable composition (Examples 1-6 and Comparative Examples 1-6) on the surface of a glass slide, and exposing the photocurable composition to the indicated dosage of 385 nm UV radiation to cure the photocurable composition. The resulting film was peeled off the glass slide and applied against the window of an attenuated total reflect infrared (ATR-IR) cell. When the top of the film was applied against the window, the IR signal of the material in contact with the window an up to a depth of 5 µm to 10 µm from the window was recorded, and the top cure percentage was assessed. When the bottom of the film (formed in contact with the glass slide) was applied against the window, the IR signal of the material in contact with the window an up to a depth of 5 µm to 10 µm from the window was recorded, and the bottom cure percentage was assessed. The cure percentages were assessed as previously described.

Examples 1-5, with a thiol component showed more complete top curing than Comparative Examples 1-6. Increasing the dosage of radiation at 385 nm from 0.6 J/cm² to 2.8 J/cm² further improved the top curing. Improved top curing can reduce the amount of color conversion agent removed during rinsing of uncured photocurable composition as described with respect to FIG. 4D. Thus, the improved top curing results in color conversion layer that retains a greater percentage or substantially all of the color conversion agent in the photocurable composition, It will be appreciated to those skilled in the art that the preceding examples are exemplary and not limiting. For example:

Although the above description focuses on micro-LEDs, the techniques can be applied to other displays with other types of light emitting diodes, particularly displays with other micro-scale light emitting diodes, e.g., LEDs less than about 10 microns across.

Although the above description assumes that the order in which the color conversion layers are formed is blue, then green, then red, other orders are possible, e.g., blue, then red, then green. In addition, other colors are possible, e.g., orange and yellow.

It will be understood that various modifications may be made without departing from the spirit and scope of the present disclosure.

What is claimed is:

1. A photocurable composition comprising:
    a nanomaterial selected to emit radiation in a first wavelength band in the visible light range in response to absorption of radiation in a second wavelength band in the UV or visible light range, wherein the second wavelength band is different than the first wavelength band;
    one or more (meth)acrylate monomers;
    a thiol crosslinker, wherein the thiol crosslinker is aliphatic or aromatic, and wherein wherein the thiol crosslinker comprises a mono-thiol, and the mono-thiol comprises ethanethiol, propanethiols, butanethiols, pentanethiols, thiophenols, thioacetic acid, glutathione, cysteine, mercaptoethanols, 2-mercaptoindole, furan-2-ylmethanethiol, 3-mercaptopropane-1,2-diol, 3-mercapto-1-propanesulfonic acid, 1-hexadecanethiol, or pentachlorobenzenethiol; and
    a photoinitiator that initiates polymerization of the one or more (meth)acrylate monomers in response to absorption of radiation in the second wavelength band.

2. The composition of claim 1, wherein the composition comprises:
    about 0.1 wt % to about 10 wt % of the nanomaterial;
    about 0.5 wt % to about 5 wt % of the photoinitiator;
    about 0.1 wt % to about 50 wt % of the thiol crosslinker; and
    about 1 wt % to about 90 wt % of the one or more (meth)acrylate monomers.

3. The composition of claim 1, wherein the composition further comprises a solvent.

4. The composition of claim 3, wherein the composition comprises:
    about 0.1 wt % to about 10 wt % of the nanomaterial;
    about 0.5 wt % to about 5 wt % of the photoinitiator;
    about 0.1 wt % to about 50 wt % of the thiol crosslinker;
    about 1 wt % to about 10 wt % of the one or more (meth)acrylate monomers; and
    about 10 wt % to about 90 wt % of the solvent.

5. The composition of claim 1, wherein the nanomaterial comprises one or more III-V compounds.

6. The composition of claim 1, wherein the nanomaterial comprises quantum dots.

7. The composition of claim 6, wherein each of the quantum dots comprises one or more ligands coupled to an exterior surface of the quantum dot, wherein the ligands are selected from the group consisting of thioalkyl compounds and carboxyalkanes.

8. The composition of claim 1, wherein the nanomaterial emits red, green or blue light.

9. The composition of claim 1, wherein the thiol crosslinker is of sufficient concentration to inhibit formation of peroxyl radicals by oxygen such that polymerization of the one or more (meth)acrylate monomers in response to absorption of radiation in the second wavelength band results in a photopolymer have a cure percentage of at least 70% throughout a depth of the photopolymer.

10. A photocurable composition comprising:
    a nanomaterial selected to emit radiation in a first wavelength band in the visible light range in response to absorption of radiation in a second wavelength band in the UV or visible light range, wherein the second wavelength band is different than the first wavelength band;
    one or more (meth)acrylate monomers;
    a thiol crosslinker, wherein the thiol crosslinker is aliphatic or aromatic, and wherein the thiol crosslinker comprises a 1,1-dithiol, and the 1,1-dithiol comprises methanedithiol, 1,1-ethanedithiol, or 1,1-cyclohexanedithiol; and
    a photoinitiator that initiates polymerization of the one or more (meth)acrylate monomers in response to absorption of radiation in the second wavelength band.

11. The composition of claim 10, wherein the composition comprises:
    about 0.1 wt % to about 10 wt % of the nanomaterial;
    about 0.5 wt % to about 5 wt % of the photoinitiator;
    about 0.1 wt % to about 50 wt % of the thiol crosslinker; and
    about 1 wt % to about 90 wt % of the one or more (meth)acrylate monomers.

12. The composition of claim 10, wherein the composition further comprises a solvent.

13. The composition of claim 12, wherein the composition comprises:
    about 0.1 wt % to about 10 wt % of the nanomaterial;
    about 0.5 wt % to about 5 wt % of the photoinitiator;
    about 0.1 wt % to about 50 wt % of the thiol crosslinker;

about 1 wt % to about 10 wt % of the one or more (meth)acrylate monomers; and about 10 wt % to about 90 wt % of the solvent.

14. A photocurable composition comprising:
a nanomaterial selected to emit radiation in a first wavelength band in the visible light range in response to absorption of radiation in a second wavelength band in the UV or visible light range, wherein the second wavelength band is different than the first wavelength band;
one or more (meth)acrylate monomers;
a thiol crosslinker, wherein the thiol crosslinker is aliphatic or aromatic, and wherein the thiol crosslinker comprises a 1,3-di-thiol, and the 1,3-dithiol comprises dihydrolipoic acid; and
a photoinitiator that initiates polymerization of the one or more (meth)acrylate monomers in response to absorption of radiation in the second wavelength band.

15. The composition of claim 14, wherein the composition comprises:
about 0.1 wt % to about 10 wt % of the nanomaterial;
about 0.5 wt % to about 5 wt % of the photoinitiator;
about 0.1 wt % to about 50 wt % of the thiol crosslinker; and
about 1 wt % to about 90 wt % of the one or more (meth)acrylate monomers.

16. The composition of claim 14, wherein the composition further comprises a solvent.

17. The composition of claim 16, wherein the composition comprises:
about 0.1 wt % to about 10 wt % of the nanomaterial;
about 0.5 wt % to about 5 wt % of the photoinitiator;
about 0.1 wt % to about 50 wt % of the thiol crosslinker;
about 1 wt % to about 10 wt % of the one or more (meth)acrylate monomers; and
about 10 wt % to about 90 wt % of the solvent.

18. A light-emitting device comprising:
a plurality of light-emitting diodes; and
a cured composition in contact with a surface through which radiation in a first wavelength band in the UV or visible light range is emitted from each of the light-emitting diodes, wherein the cured composition comprises:
a nanomaterial selected to emit radiation in a second wavelength band in the visible light range in response to absorption of the radiation in the first wavelength band from each of the light-emitting diodes; and
a photopolymer comprising a thiol crosslinker, wherein the nanomaterial is embedded in the photopolymer, and wherein the thiol crosslinker is aliphatic or aromatic, and wherein the thiol crosslinker comprises i) a mono-thiol, and the mono-thiol comprises ethanethiol, propanethiols, butanethiols, pentanethiols, thiophenols, thioacetic acid, glutathione, cysteine, mercaptoethanols, 2-mercaptoindole, furan-2-ylmethanethiol, 3-mercaptopropane-1,2-diol, 3-mercapto-1-propanesulfonic acid, 1-hexadecanethiol, or pentachlorobenzenethiol, ii) a 1,1-dithiol, and the 1,1-dithiol comprises methanedithiol, 1,1-ethanedithiol, or 1,1-cyclohexanedithiol, or iii) the thiol crosslinker comprises a 1,3-di-thiol, and the 1,3-dithiol comprises dihydrolipoic acid.

19. The light emitting device of claim 18, wherein a top cure percentage of the photopolymer is at least 70%.

* * * * *